US010361364B2

(12) United States Patent
Clevenger et al.

(10) Patent No.: US 10,361,364 B2
(45) Date of Patent: Jul. 23, 2019

(54) CO-FABRICATION OF MAGNETIC DEVICE STRUCTURES WITH ELECTRICAL INTERCONNECTS HAVING REDUCED RESISTANCE THROUGH INCREASED CONDUCTOR GRAIN SIZE

(71) Applicant: INTERNATIONAL BUSINESS MACHINES CORPORATION, Armonk, NY (US)

(72) Inventors: Lawrence A. Clevenger, LaGrangeville, NY (US); Liying Jiang, Albany, NY (US); Sebastian Naczas, Albany, NY (US); Michael Rizzolo, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 15/622,668

(22) Filed: Jun. 14, 2017

(65) Prior Publication Data

US 2018/0366640 A1    Dec. 20, 2018

(51) Int. Cl.
*H01L 27/22* (2006.01)
*H01L 43/12* (2006.01)
*H01L 43/02* (2006.01)

(52) U.S. Cl.
CPC ............ *H01L 43/12* (2013.01); *H01L 27/222* (2013.01); *H01L 43/02* (2013.01)

(58) Field of Classification Search
None
See application file for complete search history.

(56) References Cited

U.S. PATENT DOCUMENTS 3,808,680 A    5/1974    Lafrate et al.
5,691,238 A    11/1997    Otvanzino et al.
(Continued)

FOREIGN PATENT DOCUMENTS

WO    2015/026390 A1    2/2015

OTHER PUBLICATIONS

Durlam et al., "A 1-Mbit MRAM Based on 1T1MTJ Bit Cell Integrated With Copper Interconnects," IEEE Journal of Solid-State Circuits. vol. 38. No. 5. May 2003. 769-773.
(Continued)

*Primary Examiner* — Calvin Y Choi
(74) *Attorney, Agent, or Firm* — Tutunjian & Bitetto, P.C.; Vazken Alexanian

(57) ABSTRACT

A method of forming magnetic device structures and electrical contacts, including removing a portion of a second interlayer dielectric (ILD) layer to expose an underlying portion of a cap layer in a first device region, wherein the cap layer is on a first ILD layer, while leaving an ILD block in a second device region, forming a spacer layer on the exposed portion of the cap layer in the first device region, forming an electrical contact layer on the spacer layer in the first device region, forming a magnetic device layer on the electrical contact layer and ILD block, removing portions of the magnetic device layer to form a magnetic device stack on the ILD block, and removing portions of the electrical contact layer to form electrical contact pillars, wherein the portions of the electrical contact layer and portions of the magnetic device layer are removed at the same time.

11 Claims, 12 Drawing Sheets

(56) References Cited

U.S. PATENT DOCUMENTS

| | | |
|---|---|---|
| 7,064,076 B2 | 6/2006 | Kulkarni |
| 8,357,609 B2 | 1/2013 | Ryan |
| 8,866,242 B2 | 10/2014 | Li et al. |
| 2001/0050385 A1 | 12/2001 | Kotecki et al. |
| 2005/0051783 A1* | 3/2005 | Song .................... H01L 33/405 257/90 |
| 2005/0158881 A1* | 7/2005 | Sharma .................. G11C 11/16 438/3 |
| 2010/0109106 A1* | 5/2010 | Zhong .................. H01L 27/228 257/421 |
| 2011/0101431 A1* | 5/2011 | Takeuchi .......... H01L 21/76826 257/295 |
| 2011/0275220 A1 | 11/2011 | Wu et al. |
| 2012/0080793 A1 | 4/2012 | Danek et al. |
| 2012/0098133 A1 | 4/2012 | Yang et al. |
| 2013/0187273 A1 | 7/2013 | Zhang et al. |
| 2015/0014152 A1 | 1/2015 | Hoinkis et al. |
| 2015/0263267 A1* | 9/2015 | Kanaya .................. H01L 43/08 257/421 |
| 2015/0348832 A1 | 12/2015 | Bruce et al. |
| 2016/0268458 A1* | 9/2016 | Kimoto ............... H01L 31/0747 |
| 2016/0365505 A1 | 12/2016 | Lu et al. |
| 2017/0069726 A1* | 3/2017 | Kye ...................... H01L 29/401 |

OTHER PUBLICATIONS

Joseph et al., "Advanced Plasma Etch for the 10nm node and Beyond," SPIE Proceedings. vol. 8685. Advanced Etch Technology for Nanopatterning II, 86850A. Mar. 29, 2013. pp. 1-8.

Markert et al., "High Throughput, High Quality Dry Etching of Copper/Barrier Film Stacks," Microelectronic Engineering. vol. 50. Jan. 31, 2000. pp. 417-423.

Miyazaki et al., "Copper dry etching with precise wafer-temperature control using C12 gas as a single reactant," Journal of vacuum science & technology. B, Microelectronics and nanometer structures: processing, measurement, and phenomena: an official journal of the American Vacuum Society. vol. 15. No. 2. Mar./Apr. 1997. pp. 237-240. (Abstract only.).

* cited by examiner

CO-FABRICATION OF MAGNETIC DEVICE STRUCTURES WITH ELECTRICAL INTERCONNECTS HAVING REDUCED RESISTANCE THROUGH INCREASED CONDUCTOR GRAIN SIZE

BACKGROUND

Technical Field

The present invention generally relates to formation of magnetic device structures and electrical contacts during back-end-of-line processing, and more particularly to formation of magnetic random access memory (MRAM) and metal interconnects having increased grain size on a substrate through coordinated fabrication steps.

Description of the Related Art

Magnetoresistive random access memory (MRAM) is a high-speed low-voltage high-density, nonvolatile memory with unlimited read/write endurance. The magnetic tunnel junction (MTJ) material stack has been composed of two magnetic layers separated by a thin dielectric layer. The magnetization of the MTJ can be switched to represent either a "1" or a "0."

SUMMARY

In accordance with an embodiment of the present invention, a method of forming magnetic device structures and electrical contacts is provided. The method includes removing a portion of a second interlayer dielectric (ILD) layer to expose an underlying portion of a cap layer in a first device region, wherein the cap layer is on a first ILD layer, while leaving an ILD block in a second device region. The method further includes forming a spacer layer on at least the exposed portion of the cap layer in the first device region. The method further includes forming an electrical contact layer on the spacer layer in the first device region. The method further includes forming a magnetic device layer on the electrical contact layer and ILD block. The method further includes removing portions of the magnetic device layer to form a magnetic device stack on the ILD block. The method further includes removing portions of the electrical contact layer to form one or more electrical contact pillars, wherein the portions of the electrical contact layer and portions of the magnetic device layer are removed at the same time.

In accordance with another embodiment of the present invention, a method of forming magnetic device structures and electrical contacts is provided. The method includes removing a portion of a second ILD layer to expose an underlying portion of a cap layer in a first device region, wherein the cap layer is on a first ILD layer, while leaving an ILD block in a second device region. The method further includes forming a spacer layer on at least the exposed portion of the cap layer in the first device region, wherein the cap layer is a transition metal nitride or a transition metal carbide. The method further includes forming a copper electrical contact layer on the spacer layer in the first device region. The method further includes forming a magnetic device layer on the electrical contact layer and ILD block. The method further includes forming one or more pillar templates on the copper electrical contact layer and a reduced magnetic device template on the magnetic device layer. The method further includes removing a portion of the magnetic device layer to form a magnetic device stack below the reduced magnetic device template, and removing portions of the electrical contact layer to form one or more electrical contact pillars below the, wherein the portions of the electrical contact layer and portions of the magnetic device layer are removed at the same time.

In accordance with another embodiment of the present invention, a combination of magnetic device structures and electrical contacts on a substrate is provided. The combination of magnetic device structures and electrical contacts includes a cap layer in a first device region, one or more electrical contact pillars on the cap layer in the first device region, a magnetic device stack on a bottom device pad in a second device region, and a reduced magnetic device template on the magnetic device stack.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to electrical contacts with reduced electrical resistance formed on a region of a substrate neighboring another region including magnetic devices, for example, magnetoresistive random-access memory (MRAM). The reduced electrical resistance of the electrical interconnects, for example, electrical lines and vias, can be achieved by increases in grain sizes of the conductor material formed in the trenches and vias to reduce the number of grain boundaries that current would cross travelling between two surfaces.

Embodiments of the present invention also relate generally to utilizing a layer deposition and subtractive method to form and retain large grains of conductive material forming the electrical interconnects, so the number of grain boundaries interposed across the current flow is minimized. In some instances, a single grain of conductive material can bridge an electrically connecting span (e.g., an interconnect line or via). The conductive material grains (e.g., metal grains) can be large (i.e., equal to or greater than 300 nm), such that the grain size is greater than the dimensions of the electrical interconnect.

Embodiments of the present invention also relate generally to forming the larger grain size electrical contacts in coordination with the formation of magnetic devices (e.g., MRAM) on another region of the same substrate during back-end-of-line processing forming the electrical interconnects. A magnetoresistive random-access memory can be formed on a region of a substrate, and the layers forming the MRAM can be used for masking and forming the electrical interconnects from a conductive material layer. Etching processes can then form magnetic device stacks and electrical contact pillars at the same time using a uniform template layer. Portions of the electrical contact layer and portions of the magnetic device layer can be removed at the same time to form a magnetic device stack on an ILD block and one or more electrical contact pillars, for example, using a directional etch. The conductive material of the each of the one or more electrical contact pillars can have a grain size of 300 nm or greater.

Embodiments of the present invention also relate generally to forming metal interconnects and MRAM on adjacent regions of a substrate by forming a blanket layer of material forming a magnetic device stack on an MRAM bottom contact pad and large grain metal contact layer, and etching both the device stack and metal contact layer to form metal electrical contacts and MRAM during back-end-of-lime processing.

Exemplary applications/uses to which the present invention can be applied include, but are not limited to: universal memory devices, including, non-volatile random-access memory, and high density—low power memory devices.

Figure 1:
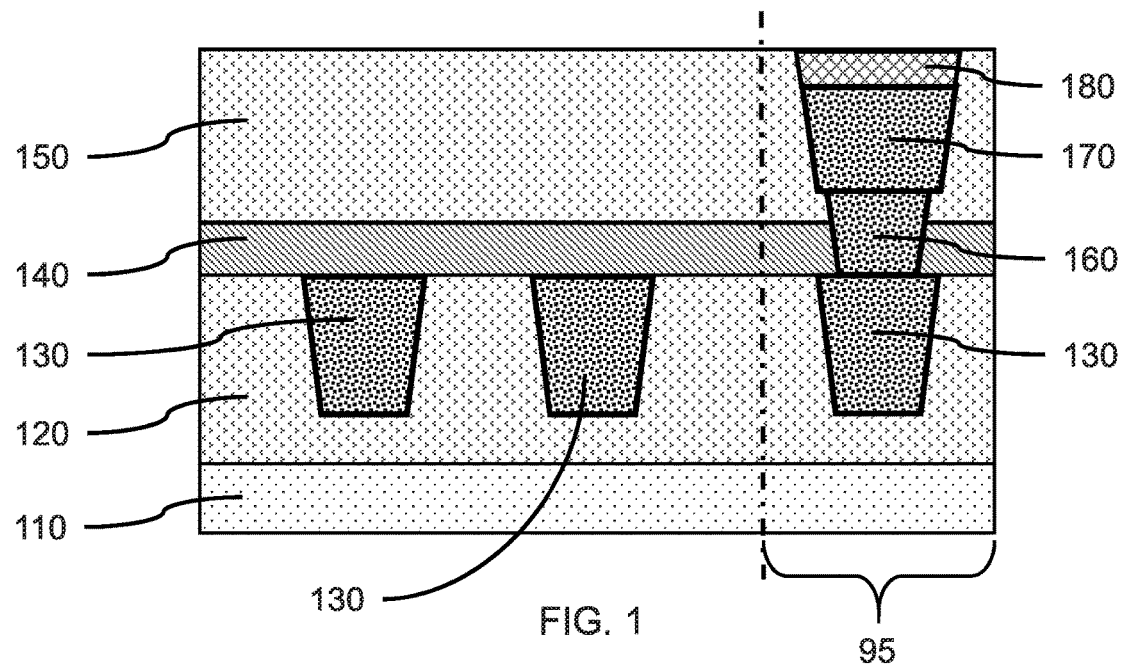
FIG. 1 is a cross-sectional side view showing device interconnects in an interlayer dielectric layer on a substrate, in accordance with an embodiment of the present invention.

Referring now to the drawings in which like numerals represent the same or similar elements and initially to FIG. 1, a cross-sectional side view of device interconnects in an interlayer dielectric layer on a substrate is shown in accordance with an embodiment of the present invention In one or more embodiments, multiple conductive and electrically insulating layers can be formed on a substrate 110, where the multiple conductive and electrically insulating layers can alternate to form metallization layers and dielectric layers of electrical interconnects to devices previously formed on and/or in the substrate 110. The devices can be active devices, including, but not limited to, transistors (e.g., MOSFETs, FinFETs, etc.), and passive devices, including, but not limited to, resistors, capacitors, and inductors.

In one or more embodiments, the substrate 110 can be a semiconductor substrate, where the substrate material can be a single semiconductor material (e.g., silicon (Si), germanium (Ge)), or a compound semiconductor material (e.g., IV-IV semiconductor, including silicon carbide (SiC), silicon-germanium (SiGe); III-V semiconductors, including, gallium-arsenide (GaAs), gallium-nitride (GaN); or II-VI semiconductors, including, zinc-selenide (ZnSe), cadmium-telluride (CdTe)).

The substrate 110 can be a single crystal wafer, a semiconductor-on-insulator (SeOI) structure, for example, silicon-on-insulator (SOI), or have an active semiconductor layer on a carrier layer, where the carrier layer provides mechanical support to the semiconductor layer. The substrate 110 can include crystalline portions, microcrystalline portions, polycrystalline portions, and amorphous portions. Other features may also be formed on and/or in the substrate 110, for example, shallow trench isolation (STI) regions and buried oxide layers (BOX).

In various embodiments, a first interlayer dielectric (ILD) layer 120 can be formed on the substrate 110, where the first ILD layer 120 can cover previously formed devices. The first ILD layer 120 can include conductive interconnects 130 that form part of a first metallization layer that forms electrical connections to device components, including, but not limited to, source/drains (S/Ds), gate structures, resistor terminals, capacitor plates, etc.

The first ILD layer 120 can be an insulating dielectric material, including, but not limited to, can be an insulating dielectric material, for example, silicon nitride (SiN), silicon oxide (SiO), silicon boronitride (SiBN), silicon carbonitride (SiCN), low-k dielectric materials, or combinations thereof.

The conductive interconnects 130 can be a polycrystalline silicon (p-Si) or conductive metal (e.g., tungsten (W), titanium (Ti), copper (Cu), aluminum (Al), molybdenum (Mo), cobalt (Co), etc.), metal nitride (e.g., titanium nitride (TiN), tantalum nitride (TaN), hafnium nitride (HfN), etc), metal carbide (e.g., titanium carbide (TiC), tungsten carbide (WC), tantalum carbide (TaC), etc), or metal silicide (e.g., titanium silicide (TiSi), tungsten silicide (WSi), molybdenum silicide (MoSi), etc) that can form electrical contacts to device components. In various instances, a conductive interconnect 130 may not extend all the way to the surface of substrate 110, for example, when an electrical connection is not intended in a particular region of the substrate. A conductive interconnect 130 can form electrical connections to source/drains (S/Ds), gate structures, resistor terminals, capacitor plates, etc, formed on and/or in the substrate 110.

The first ILD layer 120 can have a thickness in the range of about 50 nm to about 100 nm, or in the range of about 70 nm to about 80 nm. The thickness of the first ILD layer 120 can be greater than the height of the via trench(es) 210. In various embodiments the thickness of the first ILD layer 120 can be about 2 nm to about 10 nm greater than the height of the via trench(es) 210.

In various embodiments, a cap layer 140 can be formed on the first interlayer dielectric layer 120, where the cap layer 140 can provide a barrier that prevents a metal from escaping the via trench(es) 210 and diffusing into the first ILD layer 120.

The cap layer 140 can have a thickness in the range of about 5 nm to about 20 nm, where the cap layer 140 has a thickness less than the thickness of the first ILD layer 120. The thickness of the first ILD layer 120 can be sufficient to prevent diffusion of via material from migrating out of via trench(es) 210.

The cap layer 140 can be a transition metal (e.g., Ti, V, Cr, Zr, Nb, Mo, Hf, Ta, W) nitride, for example, tantalum nitride (TaN) or molybdenum nitride (MoN), or a transition metal carbide, for example, tantalum carbide (TaC) or tungsten carbide (WC), wherein the transition metal nitride or carbide acts as a barrier to the conductive material used to fill the via trench(es) 210.

In one or more embodiments, a second interlayer dielectric (ILD) layer 150 can be formed on the cap layer 140. The second ILD layer 150 can be formed on the cap layer 140. The second ILD layer 150 can be on a bottom device pad 180 and conductive pad 170 formed in the second device region 95, whereas there may be no other device or interconnect features formed in portions of the second ILD layer 150 in a first device region.

In one or more embodiments, a bottom device pad 180 can be formed on a conductive pad 170 in a second device region 95. The conductive pad 170 can be a conductive metal, metal nitride, metal carbide, or metal silicide that can form electrical contacts to device components.

The bottom device pad 180 can be a transition metal nitride (e.g., titanium nitride (TiN), tantalum nitride (TaN), hafnium nitride (HfN), etc), where the bottom device pad 180 forms a conductive electrode base for a magnetic device.

A via 160 can extend above the top surface of cap layer 140 to provide an electrical contact surface for the conductive pad 170, and be in electrical contact with conductive interconnect 130 in the second device region 95.

Figure 2:
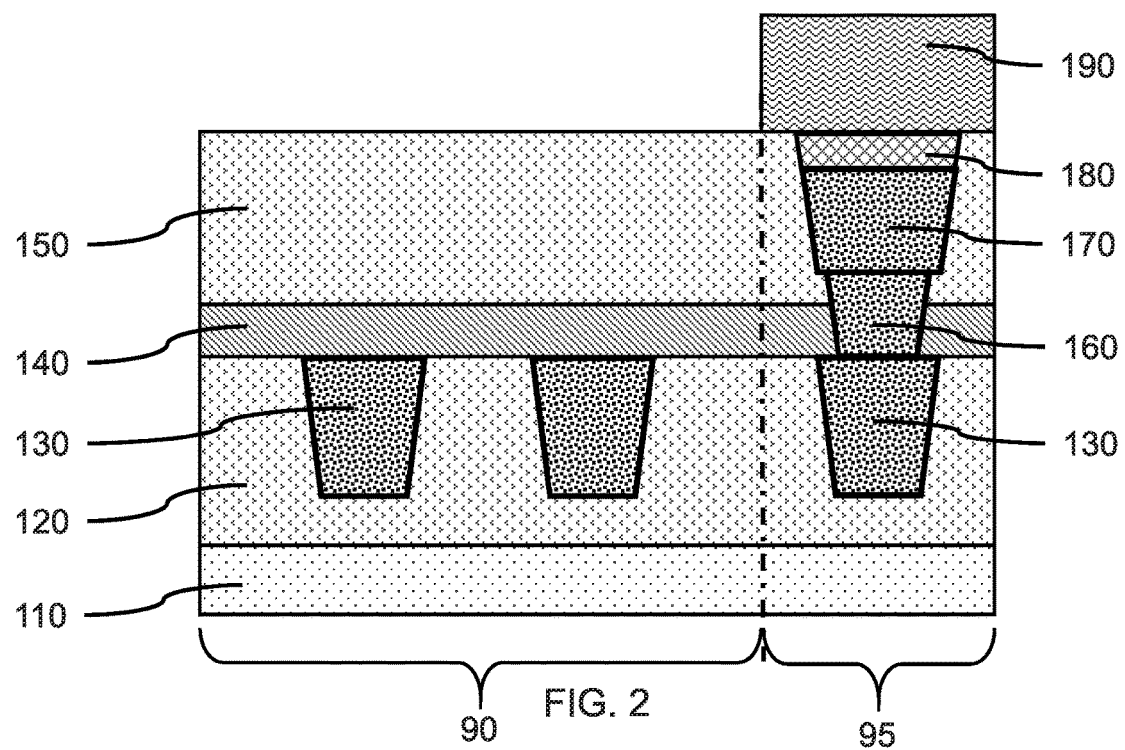
FIG. 2 is a cross-sectional side view showing an exposed interlayer dielectric layer on a first device region and a masking block on a second device region, in accordance with an embodiment of the present invention.

FIG. 2 is a cross-sectional side view showing an exposed interlayer dielectric layer on a first device region and a masking block on a second device region, in accordance with an embodiment of the present invention.

In one or more embodiments, a masking block 190 can be formed on the second device region 95 of the substrate 110. The masking block 190 can be formed by depositing and patterning a masking layer, where the masking layer can be a lithographic resist material. The masking block 190 can cover a portion of the second ILD layer 150 and one or more bottom device pads 180 and conductive pads 170. A portion of the second ILD layer 150 can be exposed in the first device region 90.

Figure 3:
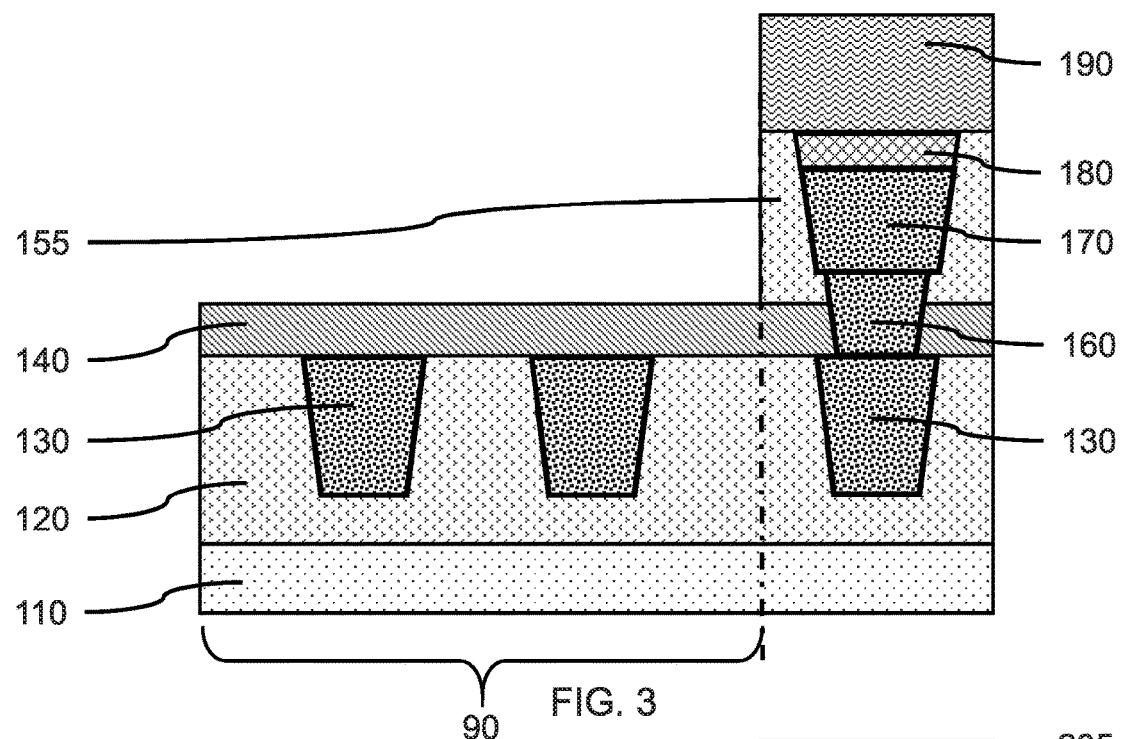
FIG. 3 is a cross-sectional side view showing an expose portion of a cap layer and a trimmed interlayer dielectric layer below the masking block, in accordance with an embodiment of the present invention.

FIG. 3 is a cross-sectional side view showing an expose portion of a cap layer and a trimmed interlayer dielectric layer below the masking block, in accordance with an embodiment of the present invention.

In one or more embodiments, a portion of the second interlayer dielectric layer 150 can be removed from the first device region 90, where removal of the second ILD layer 150 can expose at least a portion of cap layer 140. The second ILD layer 150 can be removed using a selective, directional etch, for example, a reactive ion etch (RIE). A portion of the second ILD layer 150 can remain on the cap layer 140 in the second device region 95 to form an ILD block 155. The sidewall of the ILD block 155 can form a barrier between the first device region 90 and second device region 95. The bottom device pad 180 and the conductive pad 170 can be within the ILD block, where the top surface of the bottom device pad 180 can be exposed.

Figure 4:
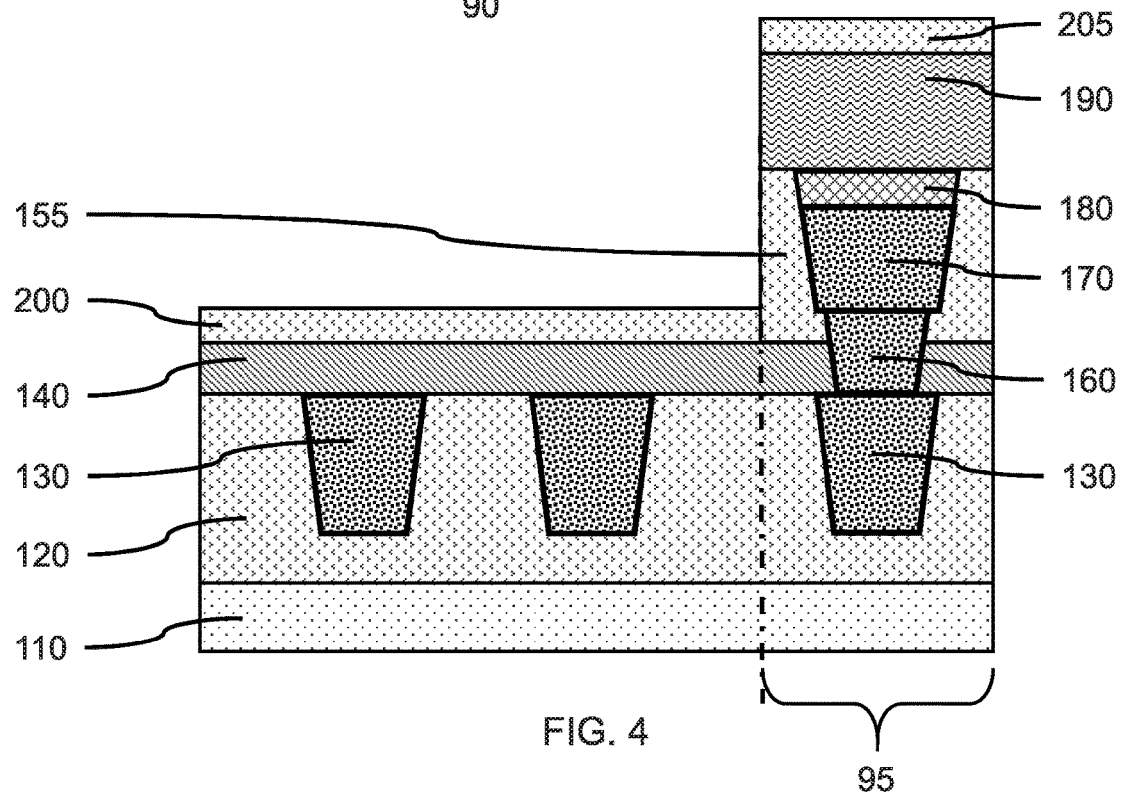
FIG. 4 is a cross-sectional side view showing a spacer layer on the cap layer and the masking block in the second device region, in accordance with an embodiment of the present invention.

FIG. 4 is a cross-sectional side view showing a spacer layer on the cap layer and the masking block in the second device region, in accordance with an embodiment of the present invention.

In one or more embodiments, a spacer layer 200 can be formed on the cap layer 140 in the first device region 90, and a spacer layer segment 205 can be formed on the top surface of the masking block 190 in the second device region 95. The spacer layer 200 and spacer layer segment 205 can be formed by a directional deposition, for example, an ion beam deposition (IBD). In various embodiments, the spacer layer 200 and spacer layer segment 205 can be an insulating, dielectric material, for example, silicon oxide (SiO), silicon nitride (SiN), low-k dielectric materials, or a combination thereof, where the spacer layer 200 and spacer layer segment 205 can be the same material. The spacer layer 200 and spacer layer segment 205 can be a low-k dielectric material, for example, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

In other embodiments, a spacer layer 200 and spacer layer segment 205 can be blanket deposited on the first device region 90 and the second device region 95, and an etch-back process used to reduce the height of the blanket deposited layer to a predetermined height on the first device region 90 and the second device region 95.

In one or more embodiments, the spacer layer 200 and spacer layer segment 205 can have a thickness (i.e., height) in the range of about 10 nm to about 50 nm, where the thickness of the spacer layer 200 and spacer layer segment 205 can be sufficient to form a top surface even with the top surface of via 160.

Figure 5:
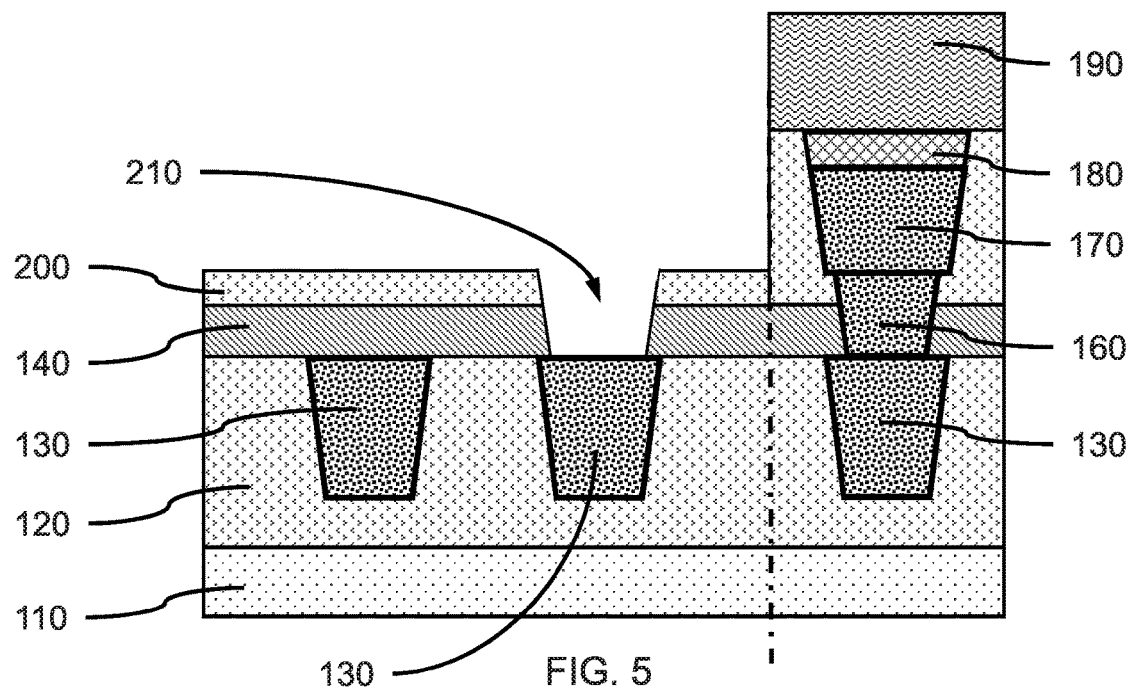
FIG. 5 is a cross-sectional side view showing a via trench formed in the spacer layer and cap layer to an electrical interconnect, in accordance with an embodiment of the present invention.

FIG. 5 is a cross-sectional side view showing a via trench formed in the spacer layer and cap layer to an electrical interconnect, in accordance with an embodiment of the present invention.

In one or more embodiments, one or more via trench(es) 210 can be formed in the spacer layer 200 and cap layer 140, where formation of the via trench(es) 210 can expose a top surface of a conductive interconnect 130 in the first ILD layer 120. Each of the one or more via trench(es) 210 can be aligned with an underlying conductive interconnect 130.

The via trench(es) 210 can be formed by depositing and patterning a masking layer, where the masking layer can be a lithographic resist material, and etching the material, for example, by RIE. The spacer layer segment 205 can be removed during formation of the via trench(es) 210 by leaving the pacer layer segment 205 unmasked.

Figure 6:
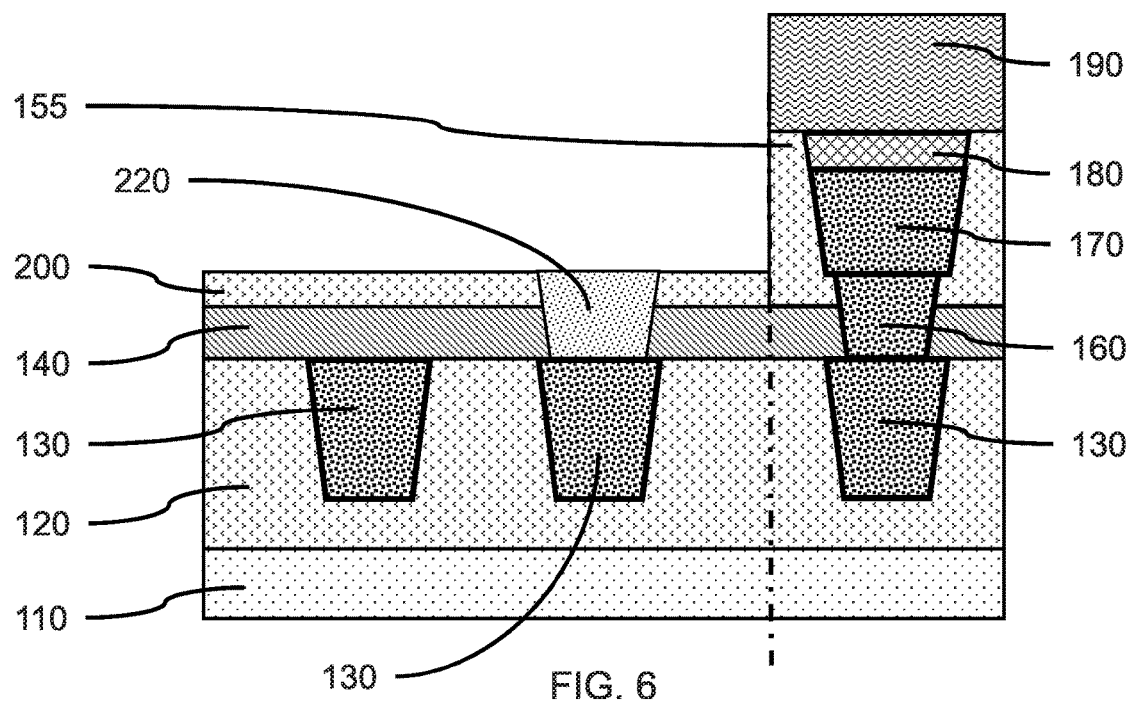
FIG. 6 is a cross-sectional side view showing a via in contact with an underlying electrical interconnect, in accordance with an embodiment of the present invention.

FIG. 6 is a cross-sectional side view showing a via in contact with an underlying electrical interconnect, in accordance with an embodiment of the present invention.

In one or more embodiments, a via 220 can be formed by forming a conductive material in each of the one or more via trench(es) 210. The conductive material can be deposited in the via trench(es) 210 and on the spacer layer 200 and etched back. The vias 220 can be aligned with an underlying conductive interconnect 130.

In various embodiments, vias 220 can be copper (Cu), cobalt (Co), ruthenium (Ru), molybdenum (Mo), or a combination thereof. In various embodiments, vias 220 can be the same conductive material as conductive interconnects 130, or the vias 220 can be a different conductive material than the conductive interconnects 130.

Figure 7:
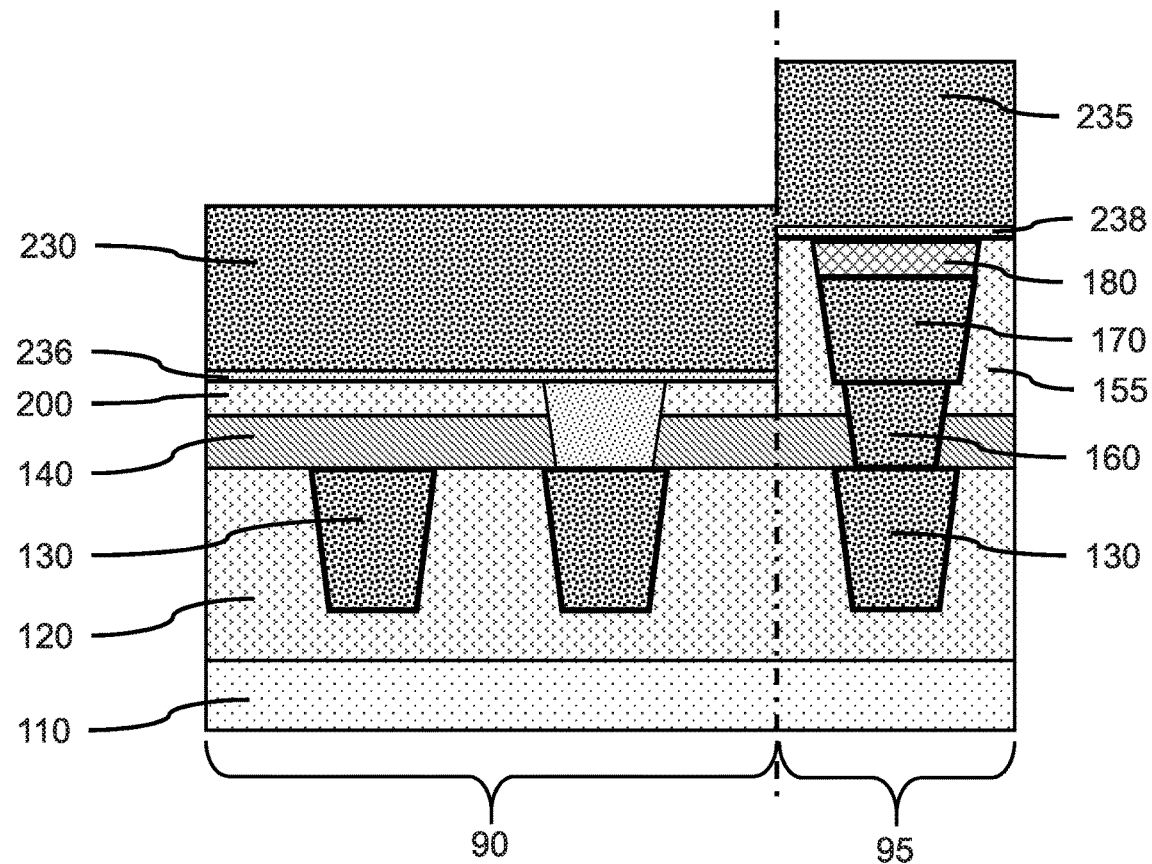
FIG. 7 is a cross-sectional side view showing an electrical contact layer formed on a liner layer on the spacer layer in the first device region and a bottom device pad in the second device region, in accordance with an embodiment of the present invention.

FIG. 7 is a cross-sectional side view showing an electrical contact layer formed on a liner layer on the spacer layer in the first device region and a bottom device pad in the second device region, in accordance with an embodiment of the present invention.

In one or more embodiments, a liner layer 236 can be formed on the exposed surfaces of the spacer layer 200 and vias 220, and a liner layer segment 238 can be formed on the ILD block 155. The liner layer 236 and liner layer segment 238 can be formed by a directional deposition, where the material is deposited on surfaces essentially perpendicular to the impinging ion beam.

The liner layer 236 and liner layer segment 238 can be a transition metal nitride, for example, titanium nitride (TiN), tantalum nitride (TaN), hafnium nitride (HfN), and combinations thereof.

In one or more embodiments, an electrical contact layer 230 can be formed on the liner layer 236 in the first device region 90, and an electrical contact block 235 can be formed on the liner layer segment 238 in the second device region 95. The electrical contact layer 230 and electrical contact block 235 can be formed by a blanket deposition on the substrate, where the top surface of the electrical contact layer 230 can be above the liner layer segment 238.

In various embodiments, the electrical contact layer 230 and electrical contact block 235 can be copper (Cu), where the liner layer 236 and liner layer segment 238 can provide a wettable surface for the deposition of copper. The liner layer 236 and liner layer segment 238 can also provide a barrier to migration and diffusion of electrical contact layer 230 and electrical contact block 235.

In a non-limiting exemplary embodiment, the electrical contact layer 230 and electrical contact block 235 can be copper (Cu) and the liner layer 236 and liner layer segment 238 can be tantalum nitride (TaN).

In various embodiments, the electrical contact layer 230 and electrical contact block 235 can be heat treated to increase the grain size of the electrical contact material. The heat treatment can increase the grain size of the conductive material forming the electrical contact layer 230 and electrical contact block 235 by 200% or more. The grain size of the electrical contact layer 230 and electrical contact block 235 can be increase to 300 nm or greater, such that the grain size can be larger than the dimensions of a device component to reduce or eliminate grain boundaries crossed by charge carriers of an electrical current. The liner layer 236 and liner layer segment 238 can prevent diffusion of the electrical contact layer 230 and electrical contact block 235 during the heat treatment.

Figure 8:
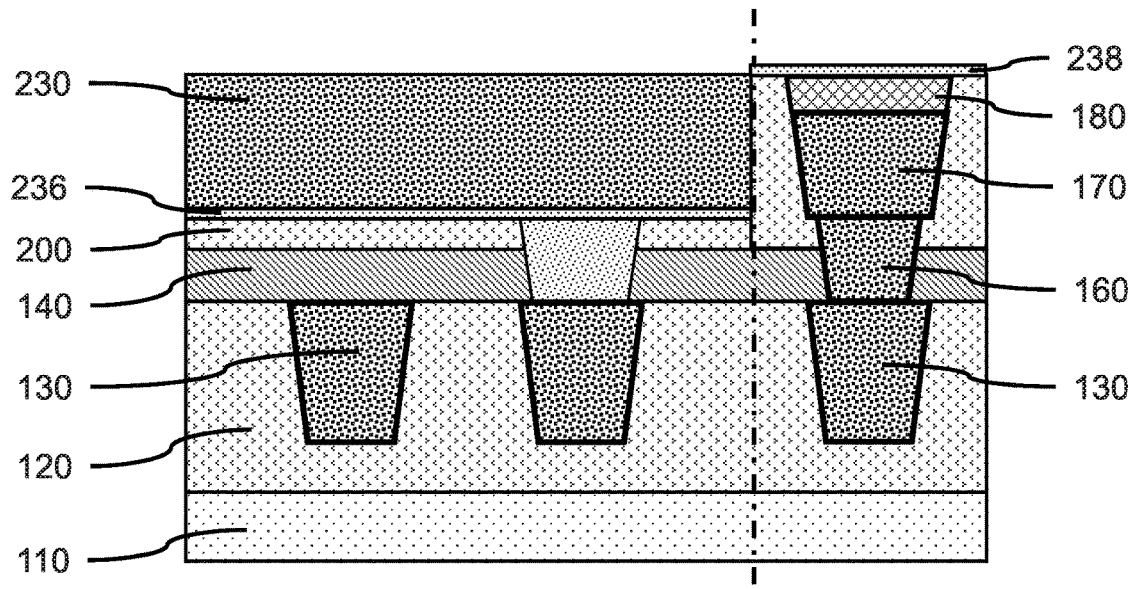
FIG. 8 is a cross-sectional side view showing the electrical contact layer with a reduced height and flat surface that exposes the liner layer segment in the second device region, in accordance with an embodiment of the present invention.

FIG. 8 is a cross-sectional side view showing the electrical contact layer with a reduced height and flat surface that exposes the liner layer segment in the second device region, in accordance with an embodiment of the present invention.

In one or more embodiments, the electrical contact block 235 and a portion of the electrical contact layer 230 can be removed to expose the underlying liner layer segment 238 on the ILD block 155. A chemical-mechanical polishing (CMP) can be used to remove at least a portion of the electrical contact block 235, and a selective etch (e.g., wet etch, dry etch) can be used to expose the liner layer segment 238 and etch back the electrical contact layer 230. In various embodiments, the surface of liner layer segment 238 and the surface of the electrical contact layer 230 can be at the same height. The CMP may cause dishing in a copper region. In other embodiments, the surface of the electrical contact layer 230 can be reduced below the surface of liner layer segment 238.

Figure 9:
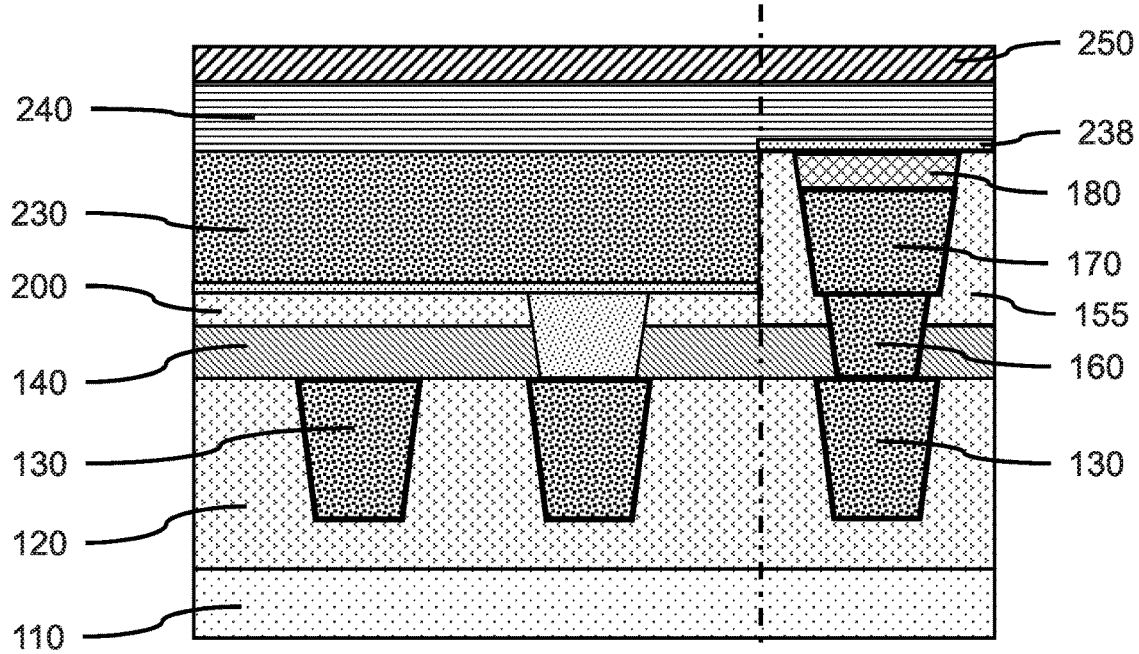
FIG. 9 is a cross-sectional side view showing a magnetic device layer and device template layer formed on the first device region and second device region, in accordance with an embodiment of the present invention.

FIG. 9 is a cross-sectional side view showing a magnetic device layer and device template layer formed on the first device region and second device region, in accordance with an embodiment of the present invention.

In one or more embodiments, a magnetic device layer 240 can be formed on the top surface of the electrical contact layer 230 and on the top surface of the liner layer segment 238. The magnetic device layer 240 can be a stack of layers formed by multiple physical vapor depositions (PVD), where multilayers are formed on top of each other to form the magnetic device layer 240.

A device template layer 250 formed on the magnetic device layer 240, where the device template layer 250 can be a hardmask layer. The device template layer 250 can be a transition metal nitride (e.g., titanium nitride (TiN), tantalum nitride (TaN), hafnium nitride (HfN), etc), where the device template layer 250 can form a conductive electrode top for a magnetic device. The magnetic device layer 240 and device template layer 250 can be formed on the first device region 90 and second device region 95.

Figure 10:
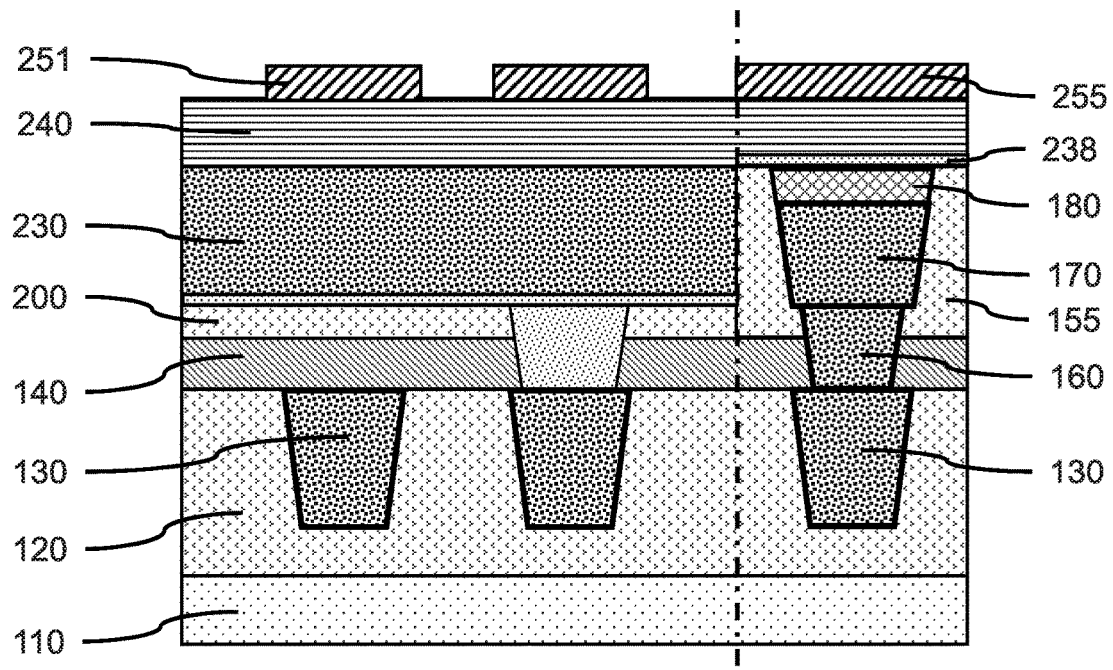
FIG. 10 is a cross-sectional side view showing a patterned device template layer on the magnetic device layer, in accordance with an embodiment of the present invention.

FIG. 10 is a cross-sectional side view showing a patterned device template layer on the magnetic device layer, in accordance with an embodiment of the present invention.

In one or more embodiments, the device template layer 250 can be patterned, for example, by lithography and etching, to expose portions of the underlying magnetic device layer 240. Portions of the device template layer 250 can be removed to form pillar template(s) 251 on the first device region 90, and one or more magnetic device templates 255 on the second device region 95. The pillar templates 251 can be aligned with the underlying conductive interconnects 130. The magnetic device template(s) 255 can be aligned with an underlying bottom device pad 180 and conductive pad 170.

Figure 11:
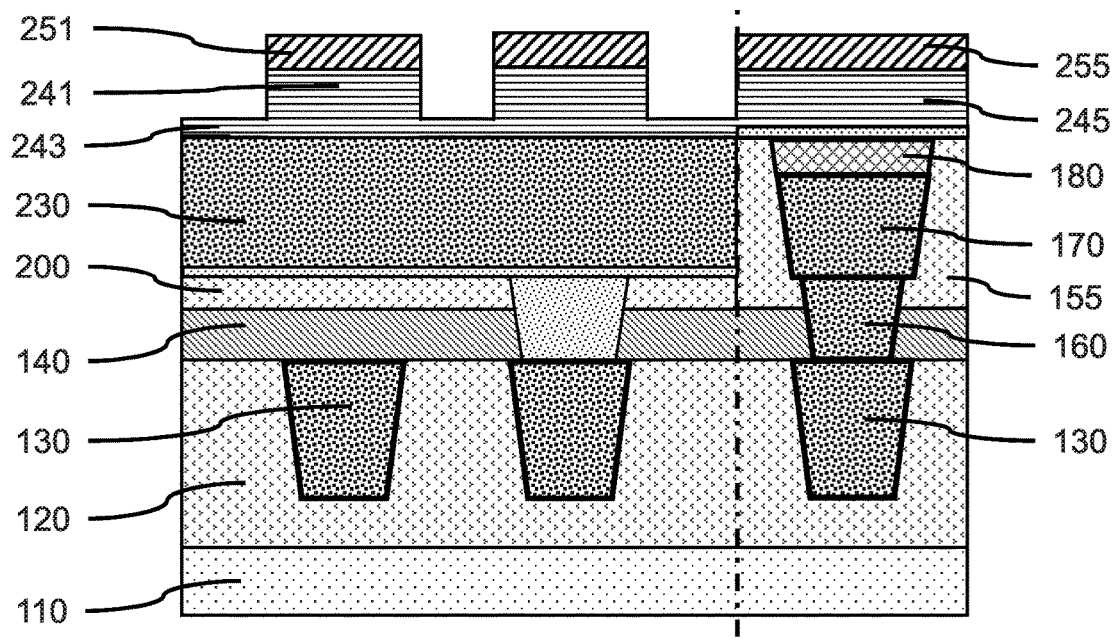
FIG. 11 is a cross-sectional side view showing a partially removed magnetic device layer in the first device region, in accordance with an embodiment of the present invention.

FIG. 11 is a cross-sectional side view showing a partially removed magnetic device layer in the first device region, in accordance with an embodiment of the present invention.

In one or more embodiments, a portion of the exposed magnetic device layer 240 can be removed from between and around pillar templates 251, and between pillar template 251 and magnetic device template 255. A magnetic device slab 243 can remain on the electrical contact layer 230. A portion of the magnetic device layer 240 having a reduced thickness can remain due to balancing of the etch rates of the magnetic tunnel junction (MTJ) material(s) and the conductive materials, where the exposed magnetic device layer 240 can be completely removed if the thicknesses and etch rates are balanced.

The magnetic device slab 243 can have a thickness in the range of about 5 nm to about 20 nm.

Figure 12:
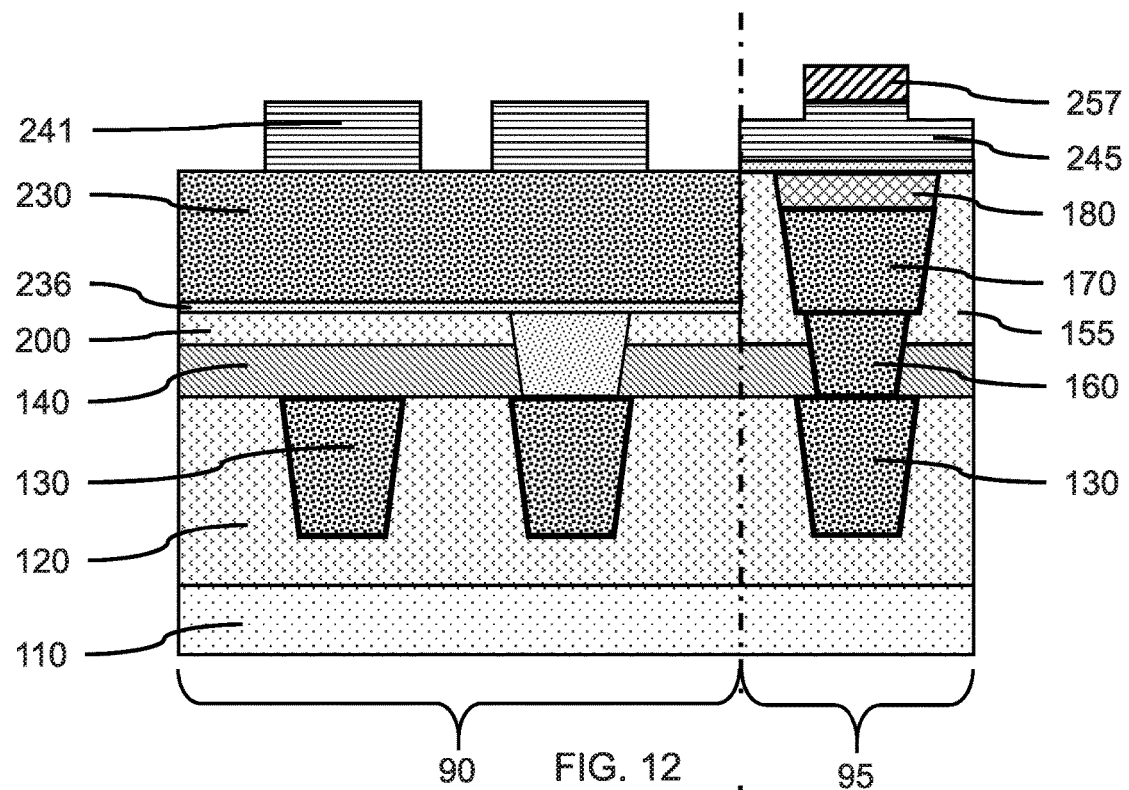
FIG. 12 is a cross-sectional side view showing magnetic device blocks on the electrical contact layer in the first device region, and a reduced magnetic device template on a partially formed magnetic device stack in the second device region, in accordance with an embodiment of the present invention.

FIG. 12 is a cross-sectional side view showing magnetic device blocks on the electrical contact layer in the first device region, and a reduced magnetic device template on a partially formed magnetic device stack in the second device region, in accordance with an embodiment of the present invention.

The pillar templates 251 can be removed from the magnetic device segments 241, and the magnetic device template 255 can be patterned to have a smaller size, thereby exposing a portion of the magnetic device block 245 in the second device region 95. The reduced magnetic device template 257 can have a width in the range of about 10 nm to about 40 nm, or in the range of about 20 nm to about 30 nm.

The remainder of the magnetic device layer 240 between pillar templates 251 forming magnetic device slab 243 can be removed to expose portions of the electrical contact layer 230, and a portion of the exposed magnetic device block 245 can be removed, where the thickness of the magnetic device slab 243 can be removed from the exposed magnetic device block 245.

Figure 13:
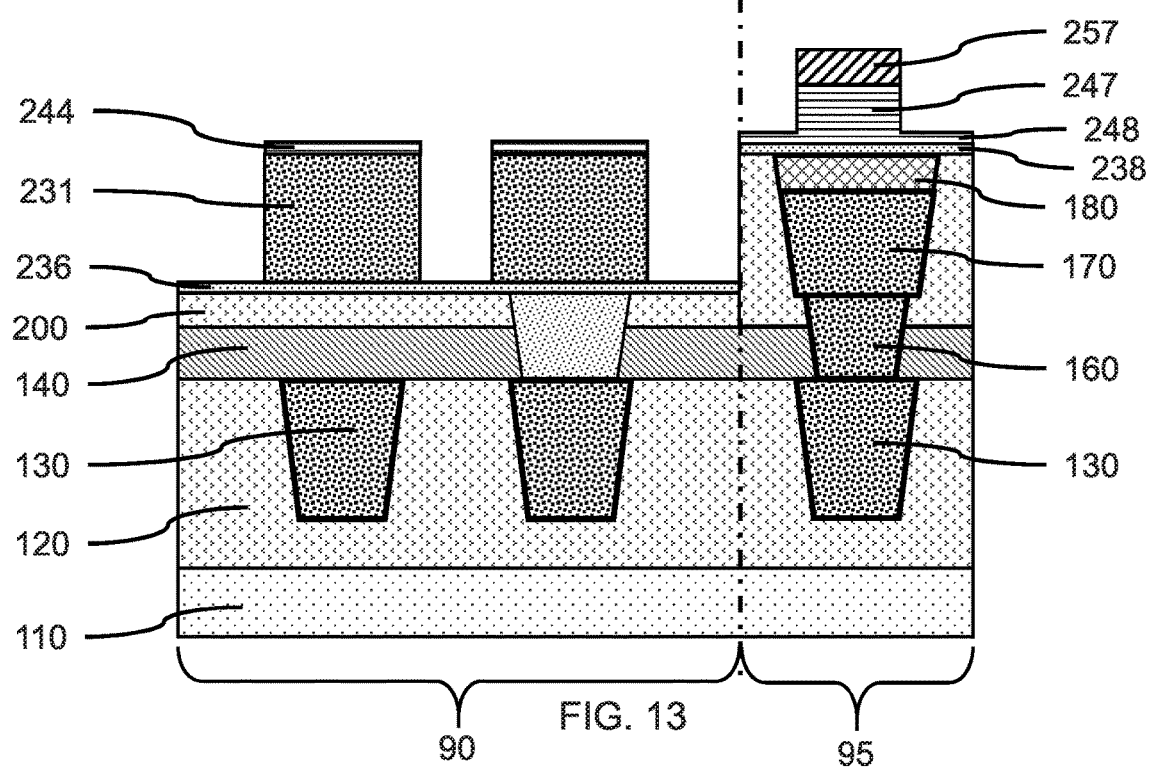
FIG. 13 is a cross-sectional side view showing a reduced magnetic device template on a magnetic device stack in the second device region, and a magnetic device cap on each electrical contact pillar in the first device region, in accordance with an embodiment of the present invention.

FIG. 13 is a cross-sectional side view showing a magnetic device template on a magnetic device stack in the second device region, and a reduced magnetic device cap on each electrical contact pillar in the first device region, in accordance with an embodiment of the present invention.

In one or more embodiments, the exposed portions of the electrical contact layer 230 can be removed to expose the liner layer 236, and form electrical contact pillars 231 on the liner layer 236. The exposed portion of the magnetic device block 245 can be reduced and the height of the magnetic device segments 241 can be reduced by the etching of the electrical contact layer 230. The magnetic device segments 241 can be reduced to form a magnetic device cap 244 on each electrical contact pillar 231 in the first device region 90. The liner layer 236 can act as an etch stop.

The magnetic device block 245 can be reduced to form a magnetic device skirt 248 around a magnetic device stack 247, where the magnetic device skirt 248 is on the liner layer segment 238.

Figure 14:
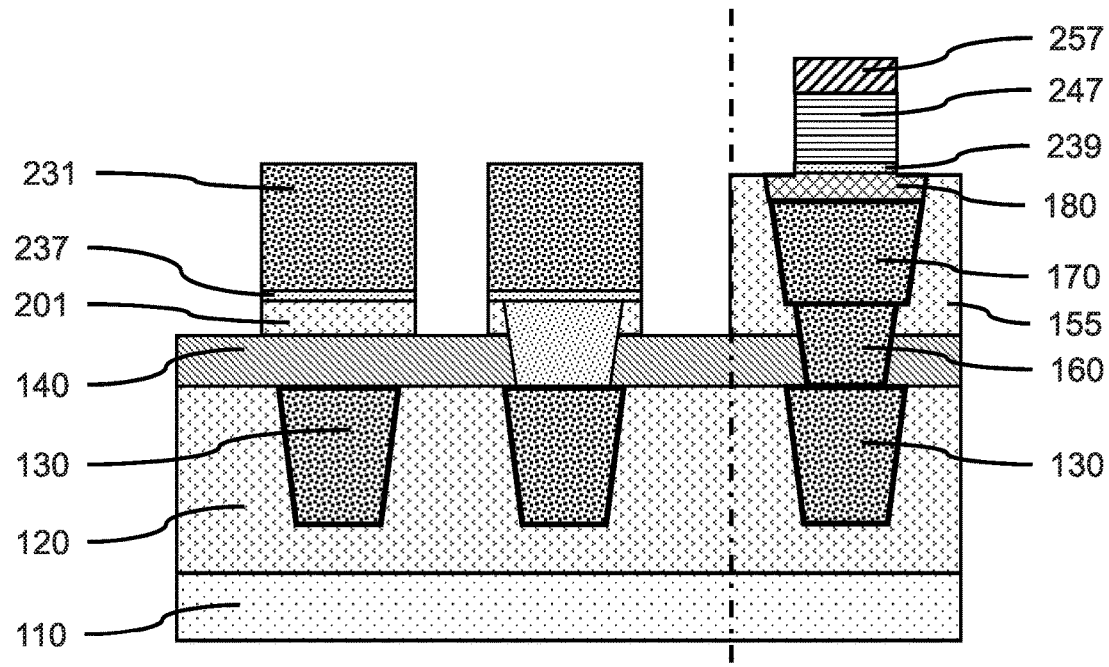
FIG. 14 is a cross-sectional side view showing electrical contact pillars on spacers in the first device region, and a magnetic device stack on a liner and bottom device pad in the second device region, in accordance with an embodiment of the present invention.

FIG. 14 is a cross-sectional side view showing electrical contact pillars on spacers in the first device region, and a magnetic device stack on a liner and bottom device pad in the second device region, in accordance with an embodiment of the present invention.

In one or more embodiments, the magnetic device skirt 248 and underlying portion of the liner layer segment 238 can be removed to leave a magnetic device stack 247 on a liner section 239. The magnetic device skirt 248 and underlying portion of the liner layer segment 238 can be removed by RIE. The magnetic device stack 247 can be a multilayer that includes a free layer and a fixed layer, where the fixed layer and free layer are different from bottom device pad 180, liner section 239, and reduced magnetic device template 257. The magnetic device stack 247 can have a width in the range of about 10 nm to about 40 nm, or in the range of about 20 nm to about 30 nm.

The magnetic device caps 244, exposed portions of the liner layer 236, and the underlying portion of the spacer layer 200 can be removed to expose the cap layer 140. Spacer plates 201 can be formed under each electrical contact pillar 231 and liner sheet 237.

Figure 15:
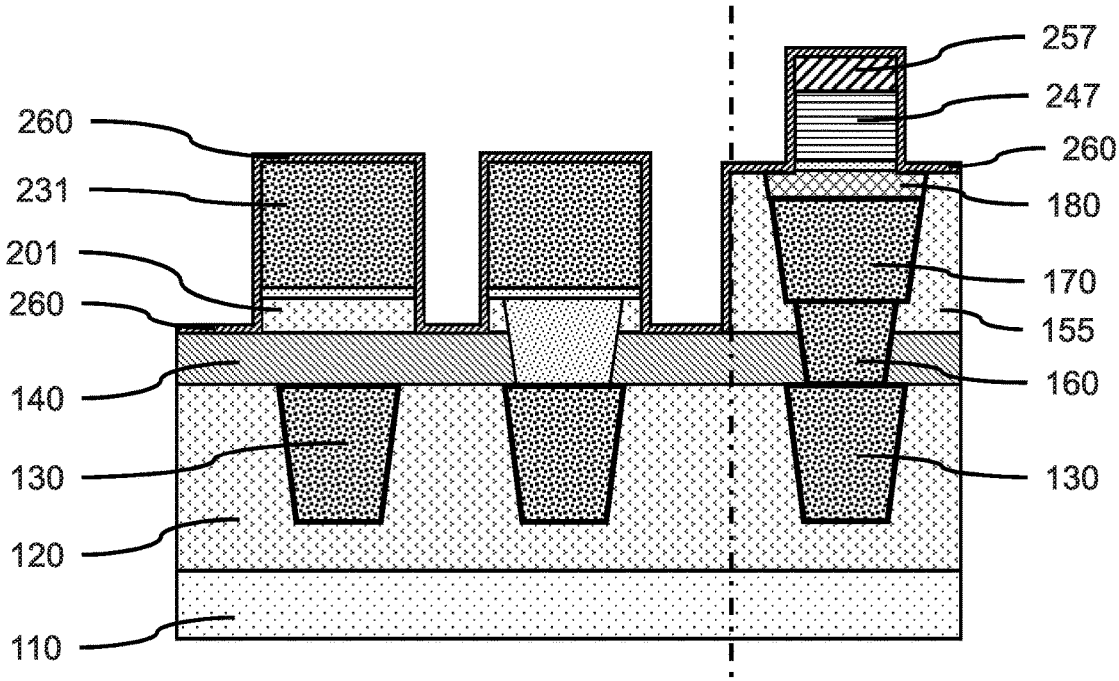
FIG. 15 is a cross-sectional side view showing a passivation layer on the electrical contact pillars, spacers, trimmed interlayer dielectric layer, magnetic device stack, and reduced magnetic device template, in accordance with an embodiment of the present invention.

FIG. 15 is a cross-sectional side view showing a passivation layer on the electrical contact pillars, spacers, trimmed interlayer dielectric layer, magnetic device stack, and reduced magnetic device template, in accordance with an embodiment of the present invention.

In one or more embodiments, a passivation layer 260 can be formed on the electrical contact pillars 231, spacer plates 201, cap layer 140, ILD block 155, magnetic device stack 247, and reduced magnetic device template 257. The passivation layer 260 can be formed by a conformal deposition, for example, atomic layer deposition (ALD) or plasma enhanced atomic layer deposition (PEALD) to control the passivation layer thickness, or by CVD or PVD, or a combination of a conformal deposition, CVD, and PVD.

The passivation layer 260 can be silicon nitride (SiN) or a transition metal nitride (e.g., titanium nitride (TiN), tantalum nitride (TaN), hafnium nitride (HfN), etc).

Figure 16:
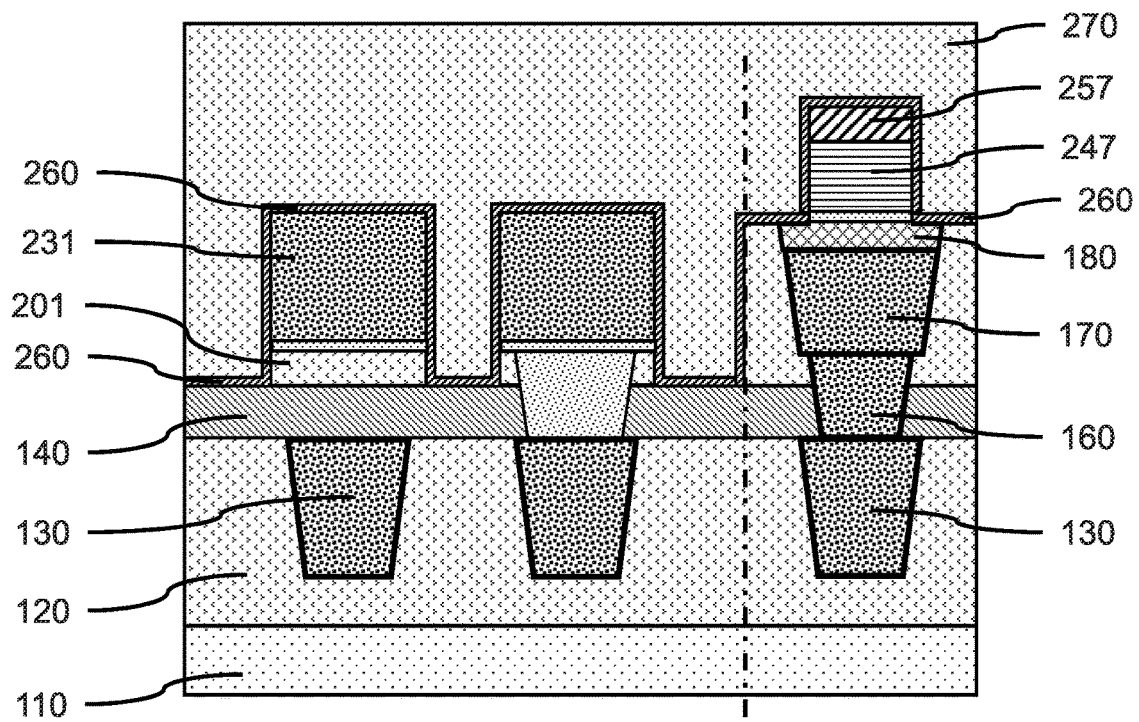
FIG. 16 is a cross-sectional side view showing a fill layer on the passivation layer, in accordance with an embodiment of the present invention.

FIG. 16 is a cross-sectional side view showing a fill layer on the passivation layer, in accordance with an embodiment of the present invention.

In one or more embodiments, a fill layer 270 can be formed on the passivation layer 260 to cover the electrical contact pillars 231, magnetic device stack 247, and reduced magnetic device template 257. The fill layer 270 can be formed by a blanket deposition, for example, a chemical vapor deposition (CVD) or plasma enhanced chemical vapor deposition (PECVD).

Figure 17:
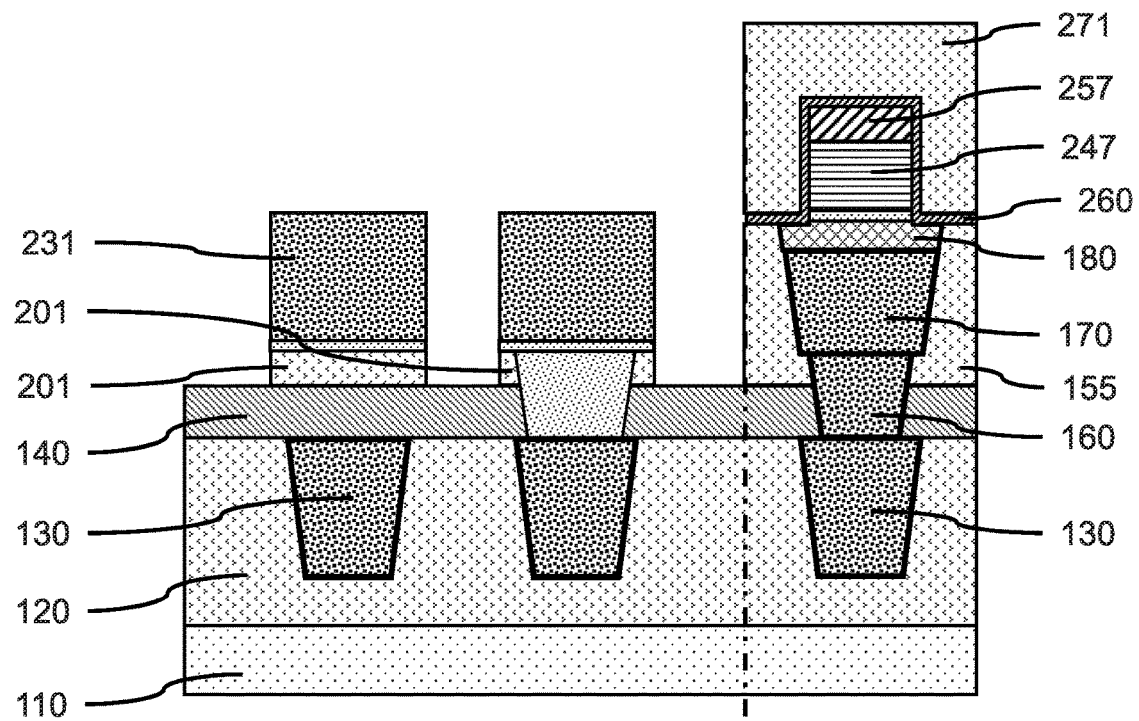
FIG. 17 is a cross-sectional side view showing exposed electrical contact pillars on spacers after removal of a portion of the passivation layer in the first device region, in accordance with an embodiment of the present invention.

FIG. 17 is a cross-sectional side view showing exposed electrical contact pillars on spacer plates after removal of a portion of the passivation layer in the first device region, in accordance with an embodiment of the present invention.

In various embodiments, the fill layer 270 in the second device region 95 can be masked and the exposed portion of the fill layer 270 in the first device region 90 can be removed to expose the underlying passivation layer 260 on the electrical contact pillars 231. The passivation layer 260 on the electrical contact pillars 231 can be removed by a selective etch, while the passivation layer 260 remains on the magnetic device stack 247 and reduced magnetic device template 257. The remaining fill layer 270 can form a fill layer cover 271 on the magnetic device stack 247 and passivation layer 260.

Figure 18:
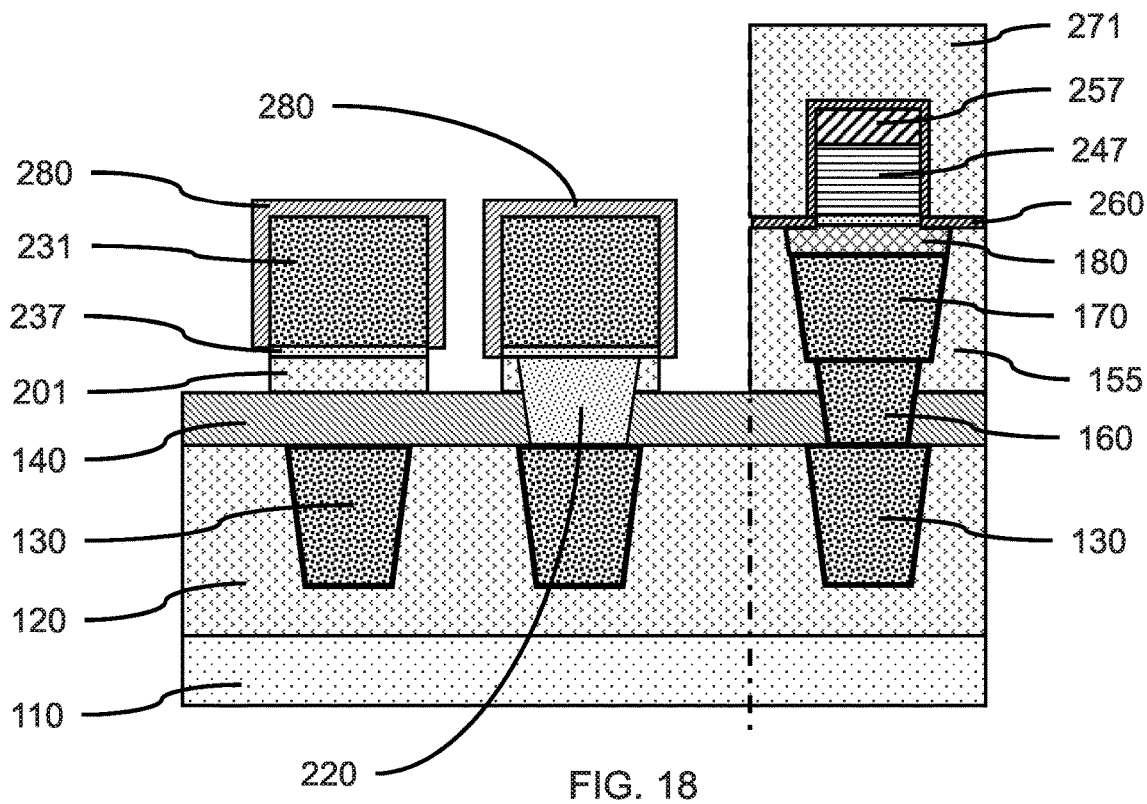
FIG. 18 is a cross-sectional side view showing a cladding layer selectively formed on the electrical contact pillars in the first device region, in accordance with an embodiment of the present invention.

FIG. 18 is a cross-sectional side view showing a cladding layer selectively formed on the electrical contact pillars in the first device region, in accordance with an embodiment of the present invention.

In one or more embodiments, a cladding layer 280 can be selectively formed on the electrical contact pillars in the first device region 90, where the cladding layer 280 can be selectively formed by ALD. The cladding layer can leave the sidewalls of spacer plates 201 and liner sheets 237 exposed. The cladding layer 280 can be manganese (Mn), cobalt (Co), ruthenium (Ru), molybdenum (Mo), or a combination thereof. In various embodiments, the cladding layer 280 can be a self-forming barrier layer of manganese (Mn), where the Mn can be alloyed with a copper (Cu) of the electrical contact pillars 231, and where the Mn can form reacted cladding layers 285 of manganese oxide (MnO) and/or manganese silicate ($MnSiO_3$).

Figure 19:
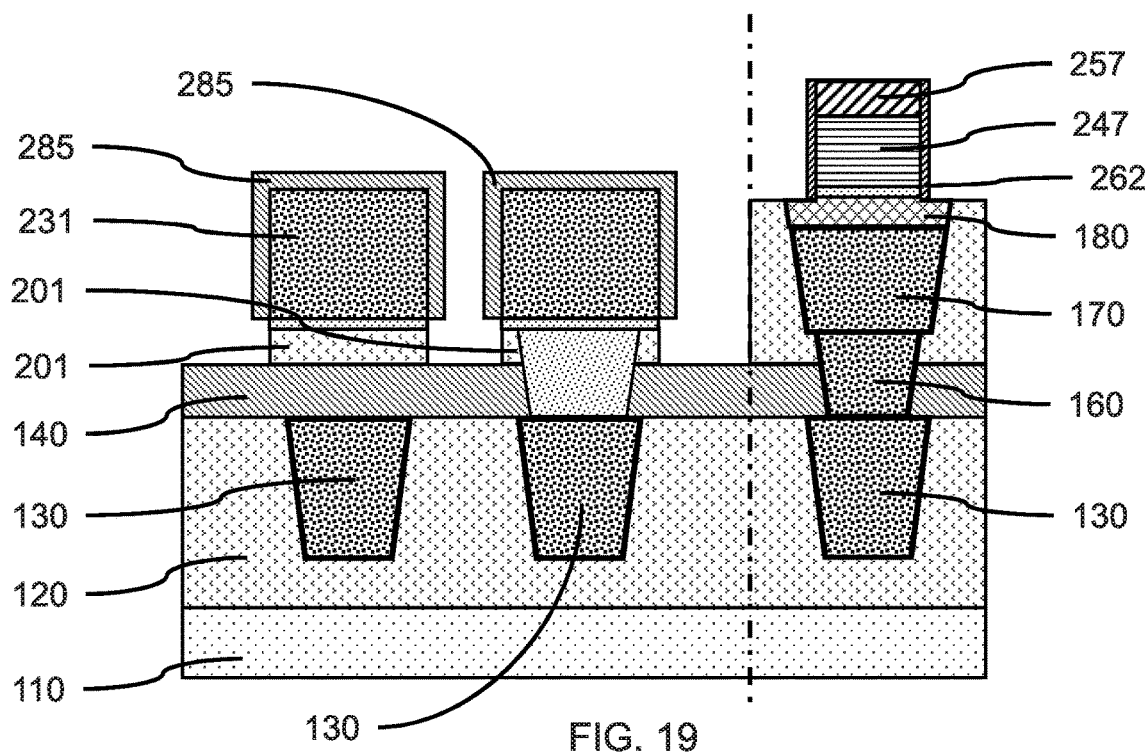
FIG. 19 is a cross-sectional side view showing reacted cladding layers on the electrical contact pillars, in accordance with an embodiment of the present invention.

FIG. 19 is a cross-sectional side view showing reacted cladding layers on the electrical contact pillars, in accordance with an embodiment of the present invention.

In various embodiments, the cladding layer 280 can be reacted to form reacted cladding layers 285 on the electrical contact pillars 231. The reaction can be a nitridation to form cobalt nitride (CoN), ruthenium nitride (RuN), molybdenum nitride (MoN), or a combination thereof. The reaction can be an oxidation to form manganese oxide (MnO), manganese silicate ($MnSiO_3$), or a combination thereof.

The fill layer cover 271 can be selectively removed from the passivation layer 260 and magnetic device stack 247.

The passivation layer 260 can be removed from the top surface of the magnetic device template 257 to form a passivation sleeve 262 on the sidewalls of the magnetic device stack 247. The passivation sleeve 262 can surround the magnetic device stack 247.

Figure 20:
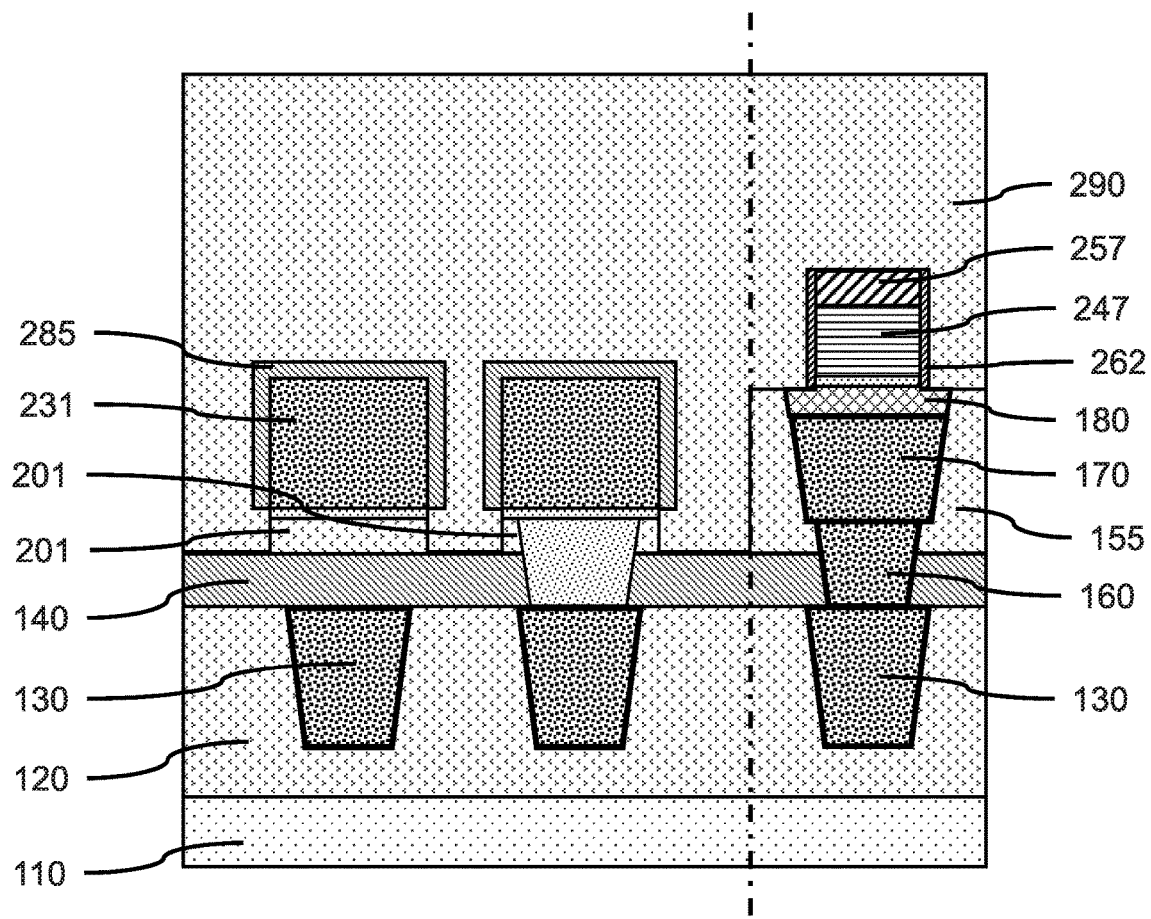
FIG. 20 is a cross-sectional side view showing a cover layer over the reacted cladding layers, reduced magnetic device template, and passivation layer on the magnetic device stack, in accordance with an embodiment of the present invention.

FIG. 20 is a cross-sectional side view showing a cover layer over the reacted cladding layers, reduced magnetic device template, and passivation layer on the magnetic device stack, in accordance with an embodiment of the present invention.

In one or more embodiments, a cover layer 290 can be formed over the reacted cladding layers, reduced magnetic device template 257, and passivation sleeve 262 on the magnetic device stack 247. The cover layer 290 can be silicon oxide (SiO), a low-k dielectric, or SiCN.

Figure 21:
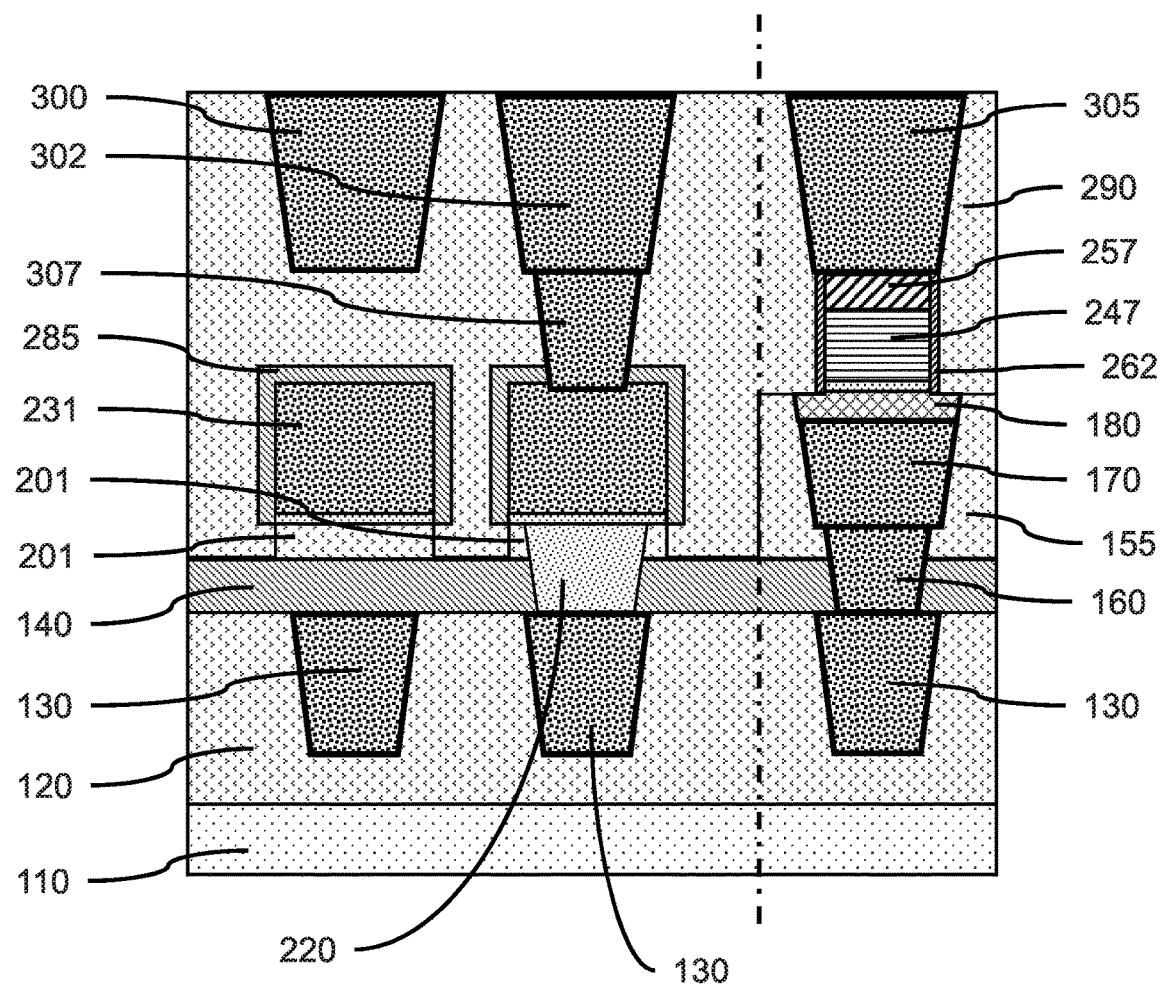
FIG. 21 is a cross-sectional side view showing vias and electrical contact lines formed in the cover layer, in accordance with an embodiment of the present invention.

FIG. 21 is a cross-sectional side view showing vias and electrical contact lines formed in the cover layer, in accordance with an embodiment of the present invention.

In one or more embodiments, secondary vias 307 and electrical contact lines 300, 302 can be formed in the cover layer 290 in the first device region 90. An electrical contact line 305 can be formed in the cover layer 290 to the top surface of the conductive reduced magnetic device template 257. The electrical contact line(s) 300, 302 to the secondary vias 307 and electrical contact pillar(s) 231 and the electrical contact line(s) 305 to the reduced magnetic device template(s) 257 can be formed at the same time, for example, by a blanket deposition and CMP.

In various embodiments, the bottom device pad 180, liner section 239, magnetic device stack 247, and device template 257 can form a magnetic tunnel junction (MTJ), where a fixed layer can be a synthetic antiferromagnetic composition, for example, those containing CoPt, and the free layer can contain CoFeB. The fixed layer and free layer are different from bottom device pad 180, liner section 239, and reduced magnetic device template 257.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of co-fabrication of magnetic device structures with electrical interconnects having reduced resistance through increased conductor grain size (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming magnetic device structures and electrical contacts, comprising:
    removing a portion of a second interlayer dielectric (ILD) layer to expose a top surface of an underlying portion of a cap layer in a first device region, wherein the cap layer is on a first ILD layer, while leaving an ILD block in a second device region;
    forming a spacer layer on at least the exposed portion of the top surface of the cap layer in the first device region;
    forming an electrical contact layer on the spacer layer in the first device region;
    forming a magnetic device layer on the electrical contact layer and ILD block;
    removing portions of the magnetic device layer to form a magnetic device stack on the ILD block; and
    removing portions of the electrical contact layer to form one or more electrical contact pillars, wherein the portions of the electrical contact layer and portions of the magnetic device layer are removed at the same time.

2. The method of claim 1, wherein a bottom device pad and a conductive pad are within the ILD block.

3. The method of claim 2, further comprising,
    forming a liner layer on the spacer layer, wherein the liner layer is between the spacer layer and the electrical contact layer, and
    forming a liner layer segment on the ILD block, wherein the liner layer segment is between the bottom device pad and the magnetic device stack.

4. The method of claim 3, further comprising forming a reduced magnetic device template on the magnetic device stack.

5. The method of claim 3, further comprising forming a via trench in the spacer layer and cap layer, and filling the via trench with a conductive material before forming the liner layer.

6. The method of claim 3, further comprising heat treating the electrical contact layer to increase the grain size of the electrical contact layer material.

7. The method of claim 6, wherein the grain size of the electrical contact layer material is increased to 300 nm or greater.

8. The method of claim 6, wherein the liner layer prevents diffusion of the electrical contact layer during the heat treatment.

9. The method of claim 6, further comprising forming reacted cladding layers on the electrical contact pillars.

10. The method of claim 9, further comprising forming a secondary via and an electrical contact line to at least one of the one or more electrical contact pillars.

11. The method of claim 10, further comprising forming an electrical contact line to the reduced magnetic device template, wherein the electrical contact line to the at least one of the one or more electrical contact pillars and the electrical contact line to the reduced magnetic device template are formed at the same time.

* * * * *